United States Patent [19]

Schilling et al.

[11] Patent Number: 5,285,465
[45] Date of Patent: Feb. 8, 1994

[54] OPTICALLY CONTROLLABLE SEMICONDUCTOR LASER

[75] Inventors: Michael Schilling, Stuttgart; Wilfried Idler, Asperg; Dieter Baums, Ludwigsburg; Gert Laube, Stuttgart; Klaus Wünstel, Schwieberdingen, Fed. Rep. of Germany; Olaf Hildebrand, Stuttgart, all of Fed. Rep. of Germany

[73] Assignee: Alcatel, N.V., Amsterdam, Netherlands

[21] Appl. No.: 966,030

[22] PCT Filed: May 26, 1992

[86] PCT No.: PCT/EP92/01175

§ 371 Date: Dec. 24, 1992

§ 102(e) Date: Dec. 24, 1992

[87] PCT Pub. No.: WO92/22111

PCT Pub. Date: Dec. 10, 1992

[30] Foreign Application Priority Data

May 31, 1991 [DE] Fed. Rep. of Germany ....... 4117865
May 31, 1991 [DE] Fed. Rep. of Germany ....... 4117868

[51] Int. Cl.$^5$ .......................... H01S 3/19; H01S 3/25
[52] U.S. Cl. .......................... 372/50; 372/6; 372/70; 372/69; 385/45; 385/49
[58] Field of Search .................... 372/50, 6, 70, 69; 385/45, 49

[56] References Cited

U.S. PATENT DOCUMENTS 4,065,729 12/1977 Gover et al. .................. 372/44
5,105,433 4/1992 Eisele et al. .................. 372/50

FOREIGN PATENT DOCUMENTS 0283248 9/1988 European Pat. Off. .

OTHER PUBLICATIONS

Proceedings of the 16th European Conference on Optical Communication, Sep. 16–20, 1990; Bd. 1, Amsterdam, NL; pp. 479–482; W. Idler et al.: "High speed integrated . . . ".
IEEE Journal of Quantum Electronics, Bd. 24, Nr. 11, Nov. 1988, NY-US; pp. 2153–2159; H. Kawaguchi et al.: "Tunable optical-wavelength . . . ".
IEEE Transactions Photonics Technology Letters, Bd. 3, Nr. 12, Dec. 1991, NY-US; pp. 1054–1057; M. Schilling et al.: "Multifunctional photonic switching . . . ".
Electronics Letters, Feb. 15, 1990, vol. 24, No. 4, pp. 243, 244; "Widely tunable Y-Coupled . . . ".
Appl. Phys. Lett. 52(10), Mar. 7, 1988; J. Salzman et al.: "Cross coupled cavity . . . ".
Appl. Phys. Lett. 39(10), Nov. 15, 1981; W. T. Tsang: "Extremely low threshold . . . ".
S. M. Sze: "Physics of Semiconductor . . . "; New York, 1981, Chichester, Brisbane, Toronto.

Primary Examiner—Georgia Y. Epps
Attorney, Agent, or Firm—Spencer, Frank & Schneider

[57] ABSTRACT

An optical device includes a semiconductor laser monolithically integrated on a substrate having a branched cavity extending above a plane that is coplanar with a base surface of the substrate, and an adjustable optical power light source for radiating light into the cavity of the semiconductor laser thereby controlling the operation of the semiconductor laser optically.

20 Claims, 4 Drawing Sheets

OPTICALLY CONTROLLABLE SEMICONDUCTOR LASER

BACKGROUND OF THE INVENTION

1. Field of the Invention

The invention is based on a semiconductor lasers, and in particular, to a semiconductor laser having a branched cavity.

2. Background Information

Such a semiconductor laser is disclosed in Electronics Letters, Feb. 15, 1990, Vol. 26, No. 4, pages 243-244. It is monolithically integrated on an n-doped indium phosphide substrate. The underside of the substrate is called the base surface. Above a plane that is coplanar with the base surface, there extends a cavity of indium gallium arsenide phosphide (InGaAsP). It is branched and, when seen from the top, has the shape of a "Y". The top view surface of the cavity may also have a different shape, for example the shape of a cross. Significant is that the cavity is contiguous. This can be described in the sense of a topological definition in that the top view surface of the cavity can be considered to be a "singly contiguous region" since it is not composed of several pieces, but of a single piece having a single edge. The cavity lies on the planar surface of an n-doped buffer layer of indium phosphide that extends above the indium phosphide substrate.

Further layers are provided above the cavity. Above the buffer layer, these layers and the cavity form a mesa which has been produced by etching. In the plane that is coplanar with the base surface, the mesa as well as the cavity have a Y shape.

Such a laser with a branched cavity is provided according to the above-mentioned publication as an electrically controllable light source for optical communications transmission systems. In particular, if its metal layer extending above the cavity is subdivided into several electrodes so that cavity regions are created which can be controlled by means of different operating currents, such a laser is distinguished by its emission wavelength being tunable over a very wide wavelength range. This characteristic is of major importance for the intended use as an electrically controllable light source.

SUMMARY OF THE INVENTION

It is the object of the invention to provide an optical device including such a laser wherein the laser is employed to perform a different function than that of an electrically controllable light source. It is another object of the invention to provide methods of using the novel optical device. This is accomplished by providing a light source with adjustable optical power from which light can be radiated into the laser cavity thus controlling operation of the laser optionally.

Modifications of the optical device are disclosed and described in more detail in the following detailed description of the preferred embodiments.

BRIEF DESCRIPTION OF THE DRAWINGS

The invention will now be described in greater detail with reference to the embodiments thereof that are illustrated in the drawings in which:

FIG. 3b depicts the wavelength of the output light signal of the first semiconductor laser as a function of time if a light signal of FIG. 3a is radiated in;

FIG. 3c depicts the time curve for the optical power $P_A$ of the output light signal of the semiconductor laser after it passes through a wavelength selective optical filter if a light signal according to FIG. 3a is radiated in;

FIG. 4b depicts the time curve for the optical power $P_A$ of the output light signal of the first semiconductor laser after passing through a wavelength selective optical filter if a light signal according to FIG. 4a is radiated in;

FIG. 6 depicts the optical power $P_A(\lambda_2)$ of the light emitted by the semiconductor laser 1 of FIG. 5 as a function of the operating current I for various optical powers of the light radiated in;

FIG. 7B depicts the optical power $P_A(\lambda_1)$ as a function of time for the light signal emitted from the first semiconductor laser if a light signal according to FIG. 7A is radiated in.

BRIEF DESCRIPTION OF THE PREFERRED EMBODIMENTS

In the description below the term "light" is employed, for reasons of simplification, for optical radiation of any wavelength and the term "light signal" is employed for "optical signal" even if, in most cases, the wavelength of the optical radiation or of the optical signal lies outside of the visible range.

Sometimes simply the term "laser" is employed instead of the term "semiconductor laser".

Figure 1:
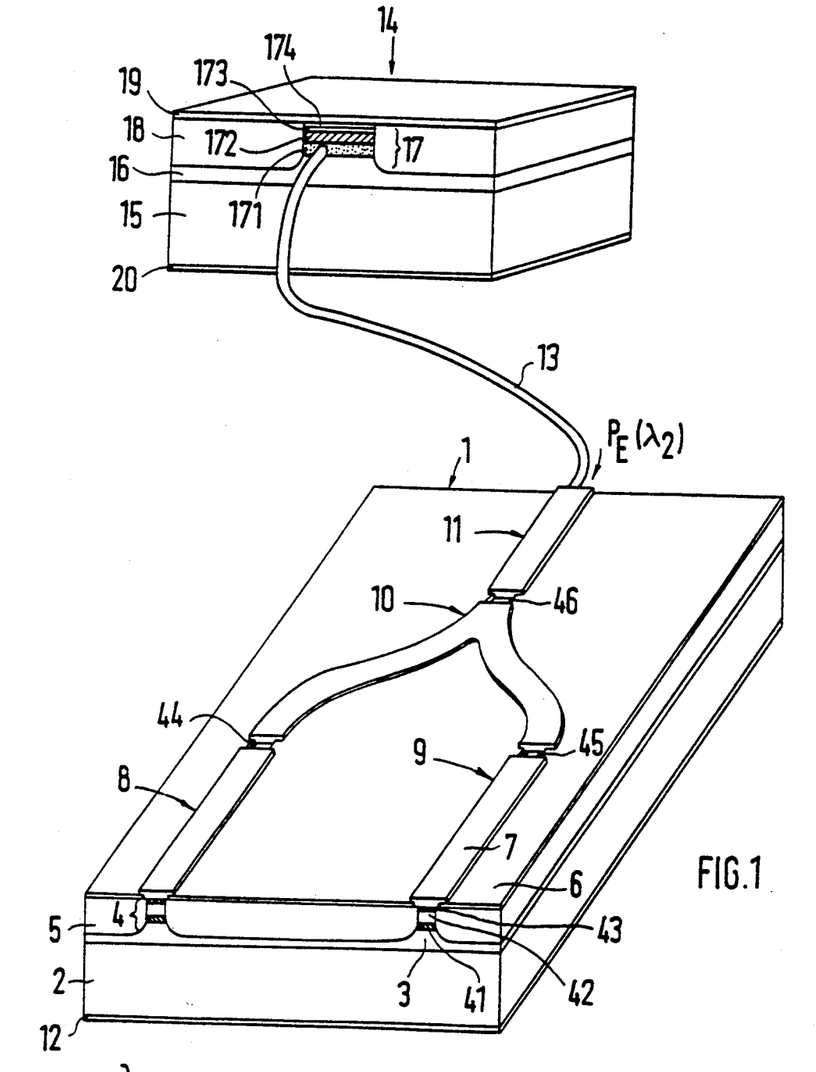
FIG. 1 depicts a first embodiment of the optical device according to the invention.

FIG. 1 shows a first semiconductor laser 1. It includes a substrate 2 of n-doped indium phosphide. Above it lies a buffer layer 3 likewise composed of n-doped indium phosphide. Part of the buffer layer forms the lowermost layer of a mesa 4 which, when seen from the top, has the shape of a Y. Mesa 4 has several layers. It includes a cavity 41 of indium gallium arsenide phosphide. This cavity is covered by a cover layer 42 of p-doped indium phosphide. Above it lies a contact layer 43 of p+-doped indium gallium arsenide. On the side of mesa 4 and above the surface of buffer layer 3 where it is not covered by layer 41, a layer of semi-insulating indium phosphide is provided in order to provide electrical insulation and optical wave guidance in mesa 4. The upper surface of this layer forms a plane with the upper surface of contact layer 43. Layer 5 is covered by a protective layer 6 of silicon dioxide, contact layer 43 is covered by a metal layer 7. Three troughs 44, 45 and 46 are etched into metal layer 7 and mesa 4, dividing the laser into four regions 8, 9, 10 and 11. According to the illustration in FIG. 1, troughs 44, 45 and 46 may also extend into cover layer 42, but not into cavity 41, depending on the optical coupling intended to be established between regions 8 to 11. In each one of regions 8 to 11, metal layer 7 forms a first electrode. A second electrode is formed in each region 8 to 11 by a metal layer 12 that is applied underneath substrate 2. During operation of semiconductor laser 1, a current that can be individually fixed or varied in each case flows from the metal layer 7 of each one of regions 8 to 11 through the respective region 8 to 11 to metal layer 12 which serves as ground contact.

Cavity 41 may have a quantum well layer structure in its cross section, as disclosed, for example, in Appl. Phys. Lett. 39 (1981), pages 786–788. Or it may have a different layer structure. The layer structure is not significant for the present invention.

If the cavity 41 of semiconductor laser 1 has the composition $In_{0.62}Ga_{0.38}As_{0.82}P_{0.18}$, semiconductor 1 emits light in a wavelength range around 1520 nm.

If cavity 41 has the composition $In_{0.57}Ga_{0.43}As_{0.73}P_{0.27}$, the semiconductor emits light in a wavelength range around 1300 nm. In both cases, the the operating currents.

Semiconductor laser 1 may also be constructed as a GaAlAs/GaAs semiconductor laser; such a structure is disclosed, for example, in Appl. Phys. Lett., 52 (1988), pages 767–769.

Mesa 4 and thus cavity 41 may be constructed not only in the form of a "Y" as shown in FIG. 1 but also, for example, in the shape of a cross, as it is also disclosed in that publication.

The optical device according to the invention includes, in addition to laser 1, also a non-illustrated laser control circuit which furnishes the operating current for the laser, or, if the laser has several regions, the operating currents. If this control circuit is switched on, it supplies the laser with operating current (or several operating currents) in such a manner that it becomes laser active and emits coherent light.

If the laser has several regions, it is the case that if a current that lies above the laser threshold current flows through at least one of the regions 8 to 11 the connection between regions 8 to 11 causes the semiconductor laser 1 to emit light also from the remaining regions 8 to 11. In the case of the semiconductor laser 1 shown here, the laser threshold current for each individual region 8, 9, 10 and 11 lies, for example, at 30 mA.

The wavelength $\lambda_1$ of the emitted coherent light is then determined, as usual, by the configuration of the laser and the setting of its operating current (or its operating currents).

According to the invention, laser 1 is subjected not only to such an electrical control but also to an optical control. Light of a suitable wavelength $\lambda_2$ is radiated from a light source into the cavity of laser 1.

The light source shown in FIG. 1 is a second semiconductor laser 14 whose generated light is radiated through a light waveguide 13 into semiconductor laser 1. Details of a suitable laser 14 will be described later.

In dependence on the optical power $P_E$ of the light radiated into semiconductor laser 1 by light source 14, the laser emits either light at a wavelength $\lambda_1$ or light at a wavelength $\lambda_2$. Wavelength $\lambda_1$ is here the wavelength given by the composition of laser 1 and its tuning (by operating currents) and $\lambda_2$ is the wavelength of the light radiated into laser 1.

At which wavelength the light is emitted by the laser in its active state is thus controllable by way of the optical power of the light radiated in. In other words: the device is an optical device including a laser which is switchable with respect to its emission wavelength by means of an optical control signal.

The light from the light signal controlling laser 1 can be radiated into region 11 of laser 1. Then, depending on the optical power of the light signal radiated in, the laser emits either light at wavelength $\lambda_1$ or at wavelength $\lambda_2$. In the same manner, the light from the light signal controlling laser 1 can also be radiated into region 8 or 9. Correspondingly, laser 1 then emits light at the first or second wavelength from regions 9 and 11 or 8 and 11, respectively.

Prerequisite for the switchability of the emission wavelength is that wavelength $\lambda_2$ of the light radiated in, does not deviate too much, for example no more than 30 nm, from wavelength $\lambda_1$. Stated more precisely, $\lambda_2$ must lie within the tuning range of the laser which extends, for example, from 1520 to 1560 nm.

Figure 2:
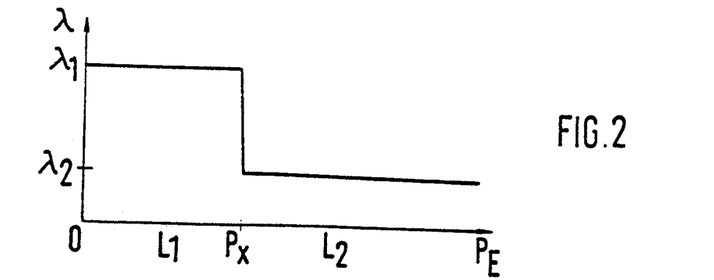
FIG. 2 depicts the wavelength of the light emitted by the semiconductor laser 1 of FIG. 1 as a function of the optical power $P_E$ of the light radiated into it.

FIG. 2 shows the wavelength of the light emitted from semiconductor laser 1 as a function of the optical power $P_E$ of the light radiated into it. Two power ranges can be distinguished. If $P_E$ lies within a power range $L_1$ that begins at zero, laser 1 emits light at the first wavelength $\lambda_1$ (described above). If $P_E$ lies above power range $L_1$, that is, in a power range $L_2$, laser 1 emits light at the second wavelength $\lambda_2$ which is equal to the wavelength of the light radiated in. The optical power at which power range $L_1$ borders on power range $L_2$ is marked $P_x$.

If, as shown in FIG. 2, the first wavelength $\lambda_1$ is the longer wavelength, the change from the second (shorter) wavelength to the first (longer) wavelength is called a down conversion because of the higher frequency and energy connected with the shorter wavelength. The first wavelength is, for example, 1523 nm, the second wavelength 1517 nm. An up conversion can also be realized with laser 1. In that case, the first wavelength is, for example, 1514 nm and the second wavelength (the wavelength of the light radiated in) is again 1517 nm.

Due to the sudden change in emission wavelength of laser 1 at the boundary between power ranges $L_1$ and $L_2$, laser 1 can be employed, for example, to form rectangular optical pulses which were deformed due to dispersion during transmission through light waveguide 13. This is the case particularly if light waveguide 13 is very long. The light source of the optical device according to the invention is then arranged far removed from its semiconductor laser and transmits a rectangular, intensity modulated optical signal which, after transmission over a long light waveguide, must be regenerated.

If, for example, its optical input signal changes from power range $L_1$ to power range $L_2$, semiconductor laser 1 will change, according to FIG. 2, to the emission of a shorter wavelength. Thus digital or analog light signals radiated into semiconductor laser 1 are converted into light signals of a first or second wavelength depending on their optical power $P_E$.

Figure 3A:
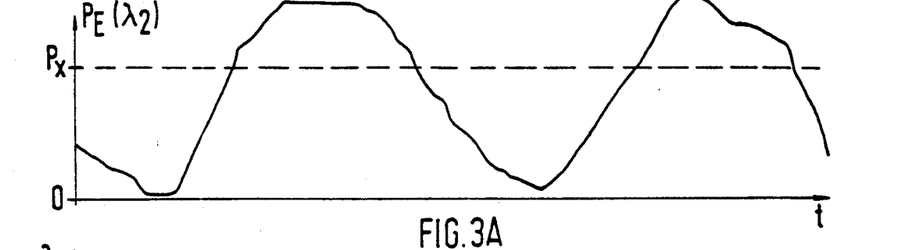
FIG. 3a depicts the optical power $P_E$ as a function of time for a noise corrupted light signal radiated into the semiconductor laser 1 of FIG. 1.
Figure 3B:
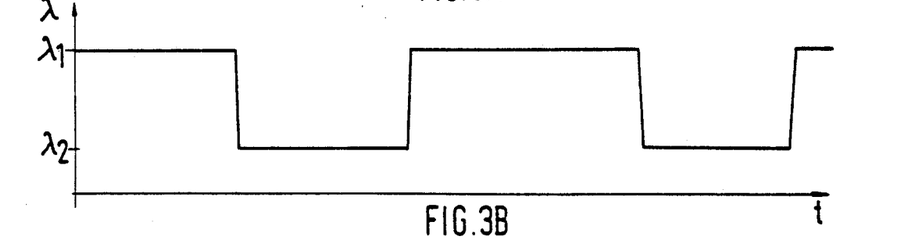

If a light signal that is composed of "blurred" rectangular pulses is radiated from semiconductor laser 14 into semiconductor laser 1, as shown in FIG. 3a as a function of time (optical power $P_E$, wavelength: $\lambda_2$), the emission wavelength of semiconductor laser 1 alternates between wavelengths $\lambda_1$ and $\lambda_2$. This is shown in FIG. 3b as a function of time. As shown in FIG. 2, an optical power $P_E$ of the optical input signal (at wavelength $\lambda_2$) below $P_x$ produces wavelength $\lambda_1$ and an optical power $P_E$ above $P_x$ produces wavelength $\lambda_2$.

Figure 3C:
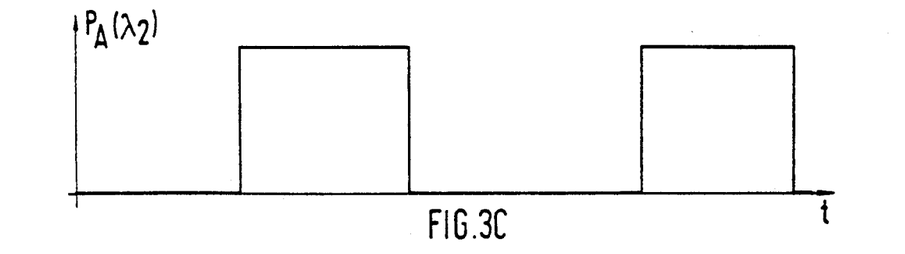

The light signal emitted by laser 1 at alternating wavelengths $\lambda_1$ and $\lambda_2$ can either be transmitted to another optical device or it is filtered in a wavelength selective filter, for example, in a Fabry-Pérot filter. If this filter is transmissive only for wavelength $\lambda_2$, the original rectangular pulses that were distorted by the optical transmission are reconstituted again. This is shown in FIG. 3c which depicts the time curve for power $P_A$ of the optical output signal (wavelength $\lambda_2$) of the optical filter.

If, however, the wavelength selective filter is transmissive for wavelength $\lambda_1$, the light signal is converted during rectangle formation from its original wavelength $\lambda_2$ to wavelength $\lambda_1$ and is simultaneously inverted.

Semiconductor laser 1 not only reconstitutes the edges of rectangular pulses, it also corrects power fluctuations of the light coming from semiconductor laser 14, insofar as these power fluctuations move within one of the power ranges $L_1$ and $L_2$.

Figure 4A:
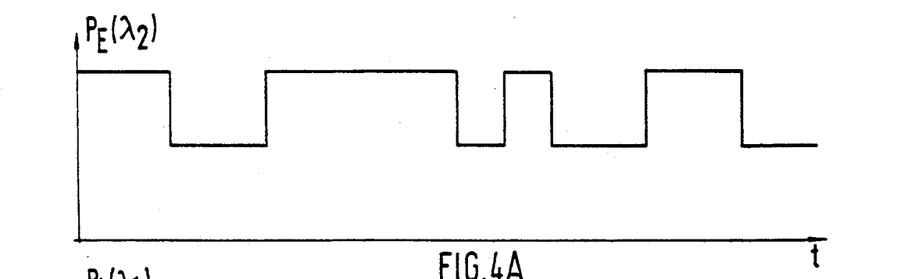
FIG. 4a depicts the optical power $P_E$ as a function of time for a light signal radiated into the semiconductor laser and containing a constant light component.

Another function of the optical device including an optical filter is to remove the constant light component if such a component is included, as shown in FIG. 4a, in the light signal to be transmitted. If the optical power $P_E$ of the light pulses moves, for example, within power range $L_2$ and the optical power of the constant light component in power range $L_1$, the light signal radiated into semiconductor laser 1 is converted to a light signal that has the wavelength $\lambda_1$ during the time sections corresponding to the light pulses of the light signal radiated in and otherwise the wavelength $\lambda_2$.

Figure 4B:
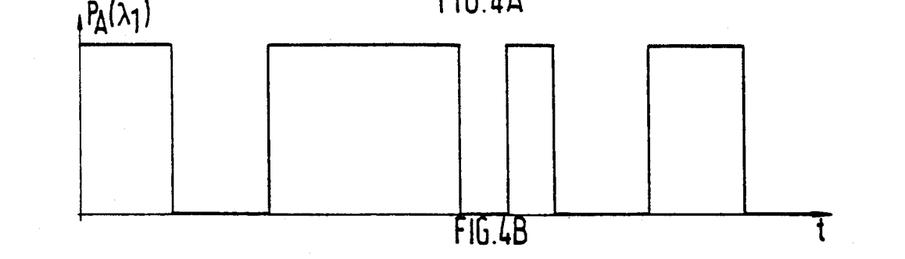

If the light signal having the alternating wavelengths $\lambda_1$ and $\lambda_2$ also passes through an optical filter that is transmissive only for wavelength $\lambda_1$, the constant light component of the light signal radiated into semiconductor laser 1 is suppressed, as shown in FIG. 4b by the time curve of the optical power $P_A$ of the output light signal at wavelength $\lambda_1$ of such an optical filter.

The uses described in connection with FIGS. 3 and 4 utilize the down conversion in semiconductor laser 1. The up conversion can be utilized in a corresponding manner.

As indicated already by the few embodiments described so far, the novel optical device disclosed here, particularly if it includes a wavelength selective optical filter, permits a multitude of applications for optical transmission.

A great advantage resulting if the novel optical device is used to convert an input light signal into an output light signal is that the light signal emitted by laser 1 may have a considerably higher intensity than the light signal radiated in. Under the aspect of optical signal transmission, laser 1 thus performs the function of a considerable signal amplification which lies in a order of magnitude of 20 dB.

One embodiment of a semiconductor laser that can be employed as a light source 14 will now be described in connection with FIG. 1. As shown in FIG. 1, a light source 14, a semiconductor laser, is connected by way of a light waveguide 13 with semiconductor laser 1 so that light can be radiated from laser 14 into laser 1. In order to prevent light from laser 1 from reaching laser 14, an optical isolator is provided that is not shown here. Semiconductor laser 14 is, for example, a semiconductor laser with distributed feedback (DFB semiconductor laser).

It is built up on a substrate 15 of indium phosphide. Above substrate 15, a buffer layer 16 of indium phosphide is applied which forms the base of a mesa 17.

Mesa 17 includes a waveguide layer 171 of n-doped indium gallium arsenide phosphide, a non-doped cavity 172 of indium gallium arsenide phosphide and a cover layer 173 of p-doped indium phosphide. Above this lies a p+-doped indium gallium arsenide layer 174. In the longitudinal direction, waveguide layer 171 forms an optical grating with buffer layer 16. On the side of mesa 17 and above the upper surface of buffer layer 16, insofar as it is not covered by mesa 17, a layer 18 of semi-insulating indium phosphide is provided whose upper surface forms a plane with the upper surface of cover layer 173. Above this and below substrate 15, there is provided a metal layer 19 and 20, respectively; metal layers 19 and 20 serve as electrodes. If a current that is greater than the laser threshold current flows through semiconductor laser 14, waveguide layer 171 feeds laser light into light waveguide 13 and from there into the cavity 41 of semiconductor laser 1. Depending on the intensity of the current flowing through semiconductor laser 14, the light radiated into semiconductor laser 1 has a different optical power $P_E$.

Instead of the semiconductor laser 14 described here, any other light source may be provided which emits light at the suitable wavelength, as described above, and whose optical power $P_E$ is variable. Other semiconductor lasers are also suitable here. Instead of the light waveguide 13 which connects semiconductor lasers 1 and 14, other means can also be employed for optical transmission between the light source and semiconductor laser 1. The transmission may also be over an air path.

Lenses can be employed to focus the light coming from the light source onto semiconductor laser 1; particularly suitable, if light waveguide 13 is employed, are lenses that are fused to the ends of light waveguide 13.

A semiconductor laser constructed, like semiconductor laser 14, on the same substrate material as semiconductor laser 1—indium phosphide in the embodiment described here can be monolithically integrated with the latter on a single substrate. In such a case, no light waveguide is required. A single lens that is glued to the trough that separates the semiconductor lasers from one another is sufficient to focus the light from the semiconductor laser corresponding to semiconductor laser 14 into the other semiconductor laser which corresponds to semiconductor laser 1.

Figure 5:
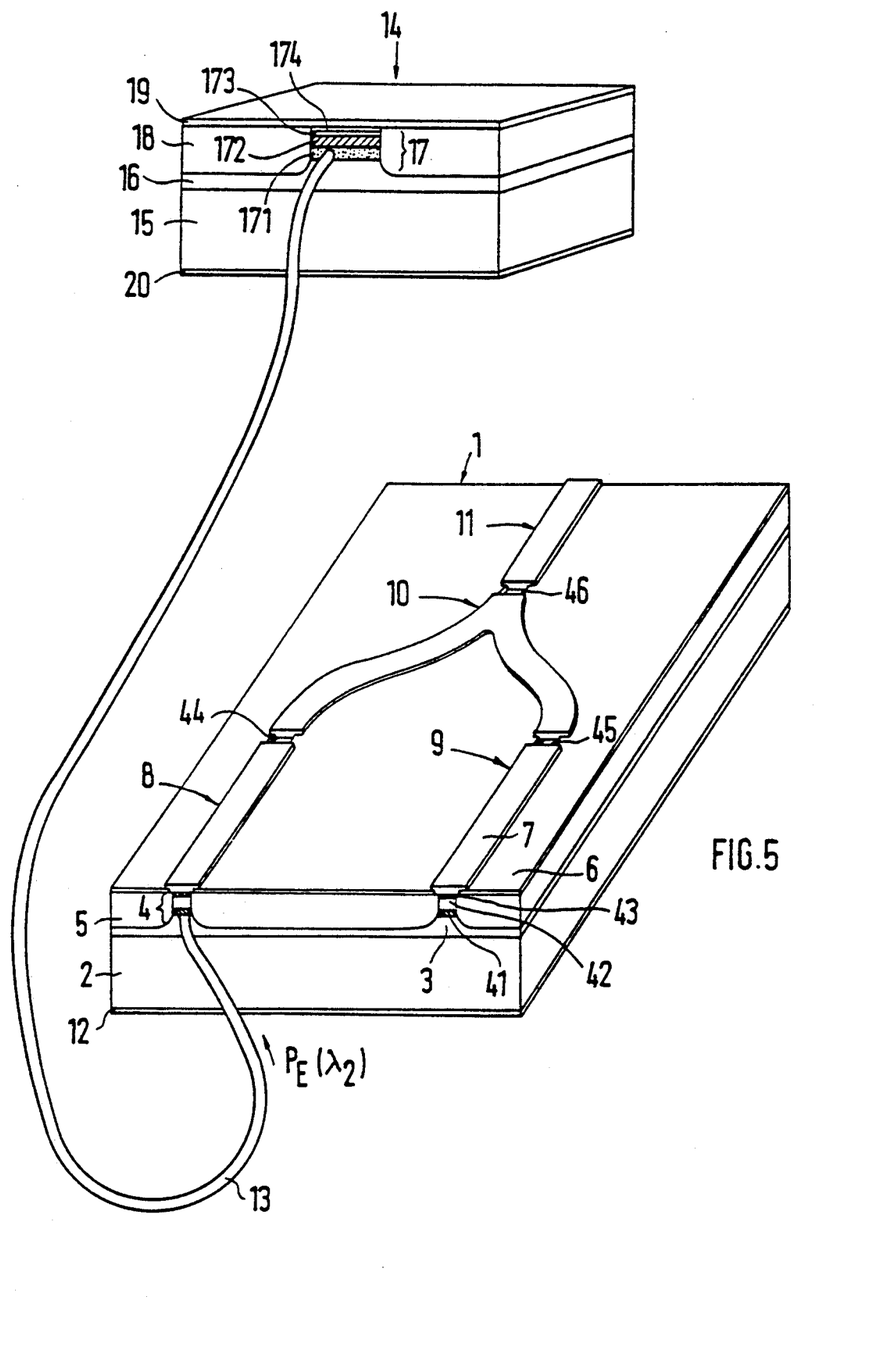
FIG. 5 depicts a second embodiment of the optical device according to the invention.
Figure 6:
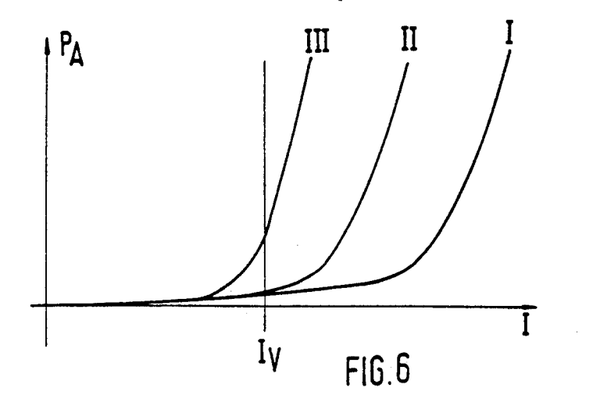
Figure 7A:
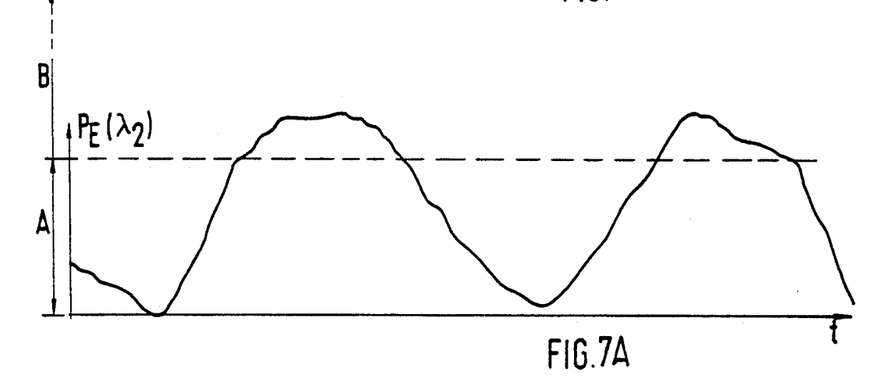
FIG. 7A depicts the optical power $P_E(\lambda_2)$ as a function of time for a noise corrupted light signal radiated into the semiconductor laser 1 of FIG. 5.
Figure 7B:
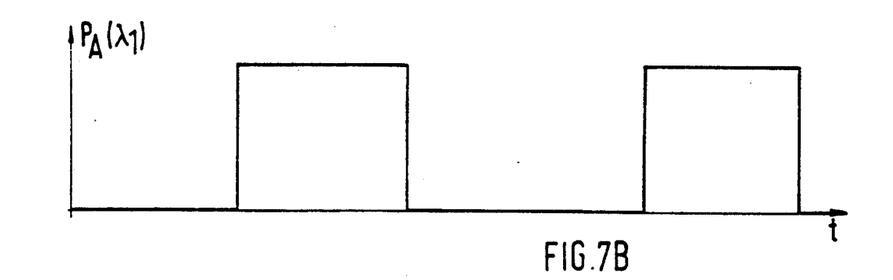

With reference to FIGS. 5 to 7, a second embodiment of the optical device according to the invention and examples for its use will now be described. The embodiment according to FIG. 5 differs from that of FIG. 1 only in that the light waveguide 13 connecting light source 14 with semiconductor laser 1 does not, as in the embodiment of FIG. 1, radiate the light into region 11 of the semiconductor laser but into one of regions 8 and 9. This, however, is not important for the principle of the invention: it is simply the preferred version for some of the embodiments to be described below.

Significant for the following embodiments of the invention is that the non-illustrated laser control circuit that is part of the optical device supplies laser 1 with operating current (or with several operating currents) in such a way that the laser is not yet put into the laser active state in which it would emit coherent light. If the laser, as illustrated and described above, has several regions which can be separately actuated by operating currents, this state can be set by a suitable combination of operating currents. If the laser is not subdivided into several regions, this state can be established with the single operating current.

According to the invention, laser 1 is not only subjected to such an electrical actuation, but also to an optical actuation by means of light from light source 14. The effect of such an optical actuation will now be described with reference to FIG. 2. This figure shows the optical power $P_A$ of the light emitted by laser 1 as a function of the operating current of the laser for various optical powers of the light radiated into laser 1. Without the radiation of light into one of regions 8 and 9, $P_A$ over I appears according to curve I. The operating current at which the curve begins to rise steeply is considerably high. It is the so-called laser threshold current. As long as the operating current is lower than that, light generated in region 11 is absorbed and no coherent light is emitted. Only above the laser threshold current does laser activity begin, that is, coherent light is emitted. With increasing radiation of light into regions 8 and 9, the absorption is compensated more and more so that laser operation begins already at a lower operating current. If the operating current I lies at $I_V$ and there is no irradiation of light (curve I), the laser is not in the laser active state. If, however, light at a sufficiently high optical power is radiated into it, $P_A$ over the operating current I appears according to curve III so that laser operation takes place already at the selected operating current $I_V$.

In other words: the laser can be switched into the laser state by light of a suitable wavelength and of a sufficiently high optical power. This is thus a laser that can be switched on and off by optical control. If the laser is laser active, that is, is switched into this state by light that is radiated into it, it emits light at a wavelength $\lambda_1$ which, as usual, is determined by the configuration of the laser and the setting of its operating current (or its operating currents).

The wavelength of the light radiated in, which is assumed to be $\lambda_2$, must be lower than a maximum wavelength corresponding to the energy of the band spacing in the laser material. Below this, it may take on any desired values so that the wavelength $\lambda_2$ of the light radiated in is shorter in any case than the wavelength $\lambda_1$ of the emitted light.

The excitation of laser 1 to emit light at a wavelength $\lambda_1$ by radiating in light at a wavelength $\lambda_2$, where $\lambda_2$ is shorter than $\lambda_1$, is comparable to photoluminescence, which is known for semiconductor crystals per se (S. M. Sze, Physics of Semiconductor Devices; New York, Chichester, Brisbane, Toronto, 1981). In that case, photoluminescence occurs as a consequence of the injection of photons.

Regarding the control of laser 1 by the light radiated in, two ranges of optical input power can be distinguished for the light radiated in: a first power range A, and a second power range B that lies above the first power range. If the optical power of the light radiated in lies within the first power range, no coherent light is emitted from the laser; if it lies within the second power range, coherent light at wavelength $\lambda_1$ is emitted from the laser.

Since the behavior of laser 1 changes suddenly at the boundary between power ranges A and B, semiconductor laser 1 can be employed to shape rectangular optical pulses which were deformed due to dispersion during the transmission through light waveguide 13. This is particularly the case if light waveguide 13 is very long. The light source of the optical device according to the invention is then disposed far removed from its semiconductor laser 1 and emits a rectangular, intensity modulated light signal which must be regenerated after its transmission over a long light waveguide. The optical device according to the invention, composed of light source, light transmission waveguide 13, laser 1 and associated control circuit is then an optical communications transmission system.

If the light signal radiated into semiconductor laser 1 is digitally modulated and its maxima have an optical power $P_E$ that lies above the boundary between power ranges A and B, that is, in power range B, its wavelength is converted by laser 1. Additionally, its original form can be recovered, as will be described below. The light signal radiated in at wavelength $\lambda_2$ causes laser 1 to be switched on and off in the rhythm of its ascending and descending edges. If switched on, the laser emits light at wavelength $\lambda_1$. As described above, wavelength $\lambda_2$ may lie far below the emission wavelength $\lambda_1$ of lasers 1. Thus, it is possible to perform a wavelength conversion over a wavelength range of several 100 nanometers.

Particularly the conversion of digital, intensity modulated light at a wavelength from the wavelength range around 850 nm into light at a wavelength from the wavelength range around 1550 nm is advantageous for optical communications transmission. Several inexpensive GaAlAs/GaAs semiconductor lasers as transmitting lasers generate light signals at a wavelength of 850 nm. These signals are transmitted over short distances to an optical multiplexer and are there bundled into an optical multiplex signal. The semiconductor laser 1 of the optical device according to the invention then converts the signal into a multiplex signal at wavelength 1550 nm which is more suitable for the transmission over very long light waveguides than the wavelength of 850 nm because its attenuation is significantly lower. The transmitting lasers may also be InGaAsP/InP semiconductor lasers which emit light in a wavelength range around 1300 nm which is then converted in laser 1 into light at a wavelength around 1550 nm.

The change of a digital, intensity modulated optical signal with respect to the shape and wavelength of its pulses will now be described with reference to FIGS. 7A and 7B. If laser receives from laser 14 a light signal at a wavelength $\lambda_2$ that is composed of "blurred" rectangular pulses and has an optical power time curve as shown in FIG. 7A, semiconductor laser 1 emits as follows: if the optical input power $P_E$ lies above the transition between regions A and B, that is, within region B, the laser emits coherent light at a wavelength $\lambda_1$ and it emits practically no light if $P_E$ lies below the mentioned transition. In FIG. 7A, the boundary between power range A and power range B for the optical input power $P_E$ is shown by a dashed line.

FIG. 7B shows the curve of the optical power $P_A$ for the light signal at wavelength $\lambda_1$ emitted by laser 1 if a light signal according to FIG. 7A is radiated in. As can be seen, the original rectangular pulses which had been distorted by the optical transmission have been reconstituted. Moreover, the light signal has been converted from its original wavelength $\lambda_2$ to wavelength $\lambda_1$.

In the above-described examples for use of the novel optical device, the above-mentioned advantage of a considerable signal gain exists as well.

The use of the above-described optical device including a laser that can be switched on by an optical control signal as an OR or AND circuit will now be described.

Since the cavity of semiconductor laser 1 has at least three ends into which light can be radiated or from which light can be emitted, it is also possible to configure the optical device in such a way that not only one but two control signals are radiated into it, each from its own light source, and the light generated by laser 1 is emitted at another end.

If a light signal can be radiated into laser 1 through region 8 as well as through region 9, for example, from far remote light sources, and the semiconductor laser is operated by its operating current or its operating currents in such a way that the optical power of a single one of the two light signals radiated into it, which reaches laser 1 either through region 8 or region 9, is sufficient to generate coherent light at wavelength $\lambda_1$ in region 11, laser 1 operates as a logic OR circuit. Then it always generates a light signal if a light signal of sufficient intensity reaches it through region 8 or through region 9 or simultaneously through regions 8 and 9. In this case again it is presumed that the operating currents are selected in such a way that they do not yet effect laser operation and thus the emission of coherent light.

If the operating currents are dimensioned so that laser operation does not yet result from a single light signal at a given intensity radiated into region 8 or 9, but it does result if two light signals are radiated in, one into region 8 and one into region 9, laser 1 acts as a logic AND circuit. The two input light signals need not have the same wavelength for operation as an OR circuit or as an AND circuit. However, their wavelength must, as described above, lie below a maximum wavelength. Additionally, in these cases, the semiconductor laser need not necessarily be operated in such a manner that the controlling light signals are radiated into regions 8 and 9 and the generated light is emitted at region 11. In principle, two other ends of the three ends of the cavity may be employed as inputs and the remaining third end of the cavity as the optical output.

If the above-described novel optical device is operated with two input light signals, other functions than those of logic circuits may also be realized. For example, it is possible to combine two digitally modulated input light signals into a multiplex light signal. This is appropriate if the signals differ sufficiently from one another so that their information can be recovered from the multiplex signal.

In a further embodiment not shown in the drawing, a further region that serves as a saturable absorber is provided between regions 8 and 9, on the one hand, and branching region 10, on the other hand. In that case, semiconductor laser 1 can also be utilized as an optical memory.

By injecting photons into the saturable absorbers from regions 8 and 9, charge carriers are generated in the absorbers. This reduces the absorption in the absorbers until they become transparent. If, as a result, light from regions 8 and 9 reaches region 11, the latter becomes laser active and generates coherent light. Even if the optical power of the light signals radiated into regions 8 and 9 now decreases, the transparency of the saturable absorbers remains in effect and thus the generation of coherent light in region 11.

The regions serving as saturable absorbers may also be disposed at other locations than between regions 8 and 9, on the one hand, and the branching region, on the other hand, for example, between other mutually adjacent regions of the cavity or at its ends.

We claim:

1. An optical device comprising:
   a semiconductor laser monolithically integrated on a substrate and having a cavity extending above a plane that is coplanar with a base surface of the substrate and has a branched configuration, and
   an adjustable optical power light source for radiating light into the cavity of the semiconductor laser thereby controlling the operation of the semiconductor laser optically.

2. An optical device according to claim 1, wherein the light radiated by the light source into the semiconductor laser has a wavelength such that, as a function of the optical power of the light radiated by the light source, the light emitted by the semiconductor laser in laser operation has one of a first wavelength and a second wavelength, the second wavelength being equal to the wavelength of the light radiated by the light source into the semiconductor laser.

3. An optical device according to claim 1, wherein, in operation the semiconductor laser has an operating current flowing therethrough which is dimensioned so that the laser is not yet put into a laser active state and wherein irradiation with light whose wavelength lies below a predetermined maximum wavelength from the light source causes the semiconductor laser to change to a laser active state and to emit coherent light at a certain wavelength which is longer than the wavelength of the light radiated into the semiconductor laser from the light source.

4. An optical device according to claim 1, wherein the light source comprises a second semiconductor laser which generates coherent light.

5. An optical device according to claim 4, wherein the second semiconductor laser is monolithically integrated with the other optically controlled semiconductor laser on the substrate thereof.

6. A method of using the optical device according to claim 2, comprising:
   radiating a noise corrupted light signal into the semiconductor laser wherein the semiconductor laser emits a light signal at one of a first and a second wavelength as a function of the optical power of the light radiated into the semiconductor laser.

7. A method of using the optical device according to claim 2, comprising:
   radiating a light signal into the semiconductor laser with an optical power of one of a first level and a second level, and
   converting the light signal into a light signal having one of a first and a second wavelength corresponding to the respective optical power of the light signal radiated into the semiconductor laser.

8. An optical device according to claim 2, further comprising;
   an optical filter which is transmissive only for one of the first wavelength and the second wavelength and is disposed in a path of a light signal emitted by the semiconductor laser.

9. A method of using the optical device according to claim 2, comprising:
   radiating a light signal having an optical power that varies over time into the semiconductor laser; and
   generating with the first semiconductor laser a light signal of a first wavelength if the optical power of the light signal input to the semiconductor laser lies in a first power range and of a second wavelength if the optical power of the light signal input to the semiconductor laser is greater than a highest power in the first power range.

10. An optical device according to claim 3 wherein the light source is a first light source and the device further comprises:
a second light source which generates light at a wavelength that lies below the predetermined maximum wavelength, and
optical transmission means for coupling the first light source and the second light source to ends of different branches of the branched cavity of the semiconductor laser.

11. A method of using an optical device according to claim 10, comprising:
combining with the semiconductor laser two digital, intensity modulated light signals from the first and second light sources into an optical multiplex signal output by said device.

12. The method of using the optical device according to claim 10, wherein an operating current flowing through the semiconductor laser and the optical power of the light signals radiated by the first and second light sources into the semiconductor laser emits coherent light at a certain wavelength if a light signal from one of the first and second light sources is radiated into one of the two branches of the branched cavity or if light signals from the first and second light sources are radiated simultaneously into both respective branches, whereby the semiconductor laser acts as an optical logic OR circuit for the two light signals radiated into the semiconductor laser.

13. A method of using the optical device according to claim 10, wherein the operating current flowing through the semiconductor laser and the optical power of the light signals radiated into it from the first and second light sources are dimensioned so that the semiconductor laser emits coherent light at the certain wavelength only if a light signal is radiated into the two branches of the branched cavity simultaneously from both of the first and second light sources whereby the semiconductor laser acts as an optical logic AND circuit for the two light signals radiated into the semiconductor laser.

14. A method of using an optical device according to claim 3 as a pulse shaper and wavelength converter, comprising:
inputting into the semiconductor laser a digital, intensity modulated noise corrupted light signal having a wavelength that lies below the predetermined maximum wavelength, and
converting the input light signal with the semiconductor laser into a light signal of the certain wavelength.

15. An optical device according to claim 3, wherein the cavity has a plurality of partial regions, the device further comprises:
at least one region serving as saturable absorber provided at one of: each end of the cavity, and between partial regions of the cavity.

16. An electrically and optionally controlled semiconductor laser arrangement, comprising:
a semiconductor laser having a substrate, a contiguous branched cavity disposed above the substrate, and a branched waveguide structure disposed above the cavity and following contours of the cavity, the waveguide structure being divided into a plurality of regions by troughs, the waveguide regions thereby defining respective cavity portions,
wherein each of the regions is individually electrically controlled by respective electrodes associated therewith to cause the semiconductor laser to emit light at a selected operating wavelength;
a light source for producing light of a certain wavelength and at an adjustable power level; and
a light waveguide for coupling the cavity of the semiconductor laser to the light source so that the light from the light source is radiated into the cavity at least one of the cavity portions;
wherein, the semiconductor laser is optically controlled to emit light at desired wavelengths by controlling the power level of the light from the light source.

17. The optically controlled semiconductor laser arrangement according to claim 16, wherein the desired wavelengths of light emitted by the laser are a first wavelength corresponding to the selected operating wavelength of the laser, and a second wavelength corresponding to the wavelength of the light from the light source, the first wavelength being emitted when the light from the light source is at a first power level, and the second wavelength being emitted when the light from the light source is at a second different power level.

18. The optically controlled semiconductor laser arrangement according to claim 17, wherein the first and second wavelengths are within a tuning range of the laser.

19. The optically controlled semiconductor laser arrangement according to claim 18, further comprising wavelength filtering means, disposed to receive the output of the laser, for passing one of the first and the second wavelengths and for blocking the other of the first and second wavelengths.

20. The optically controlled semiconductor laser arrangement according to claim 16, further comprising an optical isolator for preventing light emitted by the laser from reaching the light source through the light waveguide.

* * * * *